United States Patent [19]

Lecoy et al.

[11] Patent Number: 4,955,029
[45] Date of Patent: Sep. 4, 1990

[54] PROCESS AND DEVICE FOR REGULATING THE LIGHT POWER OF LASER DIODES

[76] Inventors: Pierre Lecoy, 11 allee du Parc de la Biévre, 94240 L'Hay Les Roses; Jean-Hubert Wilbrod, 8 rue Caruel de St Martin, 78150 Le Chesnay, both of France

[21] Appl. No.: 682,355
[22] PCT Filed: Mar. 9, 1984
[86] PCT No.: PCT/FR84/00056
§ 371 Date: Nov. 9, 1984
§ 102(e) Date: Nov. 9, 1984
[87] PCT Pub. No.: WO84/03592
PCT Pub. Date: Sep. 13, 1984

[30] Foreign Application Priority Data

Mar. 9, 1983 [FR] France ............... 83 03873

[51] Int. Cl.$^5$ ................................. H01S 3/13
[52] U.S. Cl. ........................... 372/31; 372/38
[58] Field of Search ............ 372/31, 34, 36, 38

[56] References Cited

U.S. PATENT DOCUMENTS

| Re. 31,969 | 8/1985 | Sell | 372/31 |
|---|---|---|---|
| 3,395,367 | 7/1968 | Bell et al. | 372/31 |
| 3,464,024 | 8/1969 | Bell et al. | 372/31 |
| 3,628,173 | 12/1971 | Danielmeyer | 372/31 |
| 3,831,108 | 8/1974 | LeFloch | 372/31 |
| 3,986,117 | 10/1976 | Fry et al. | 372/34 |
| 4,115,828 | 9/1978 | Rowe et al. | 372/31 |
| 4,181,899 | 1/1980 | Liu | 372/34 |
| 4,181,901 | 1/1980 | Heyke | 372/31 |
| 4,309,671 | 1/1982 | Malyon | 372/31 |
| 4,501,022 | 2/1985 | Oswald | 372/31 |

FOREIGN PATENT DOCUMENTS

| 60033 | 9/1982 | European Pat. Off. | 372/97 |
|---|---|---|---|
| 39130 | 3/1983 | Japan | 372/31 |
| 222584 | 12/1983 | Japan | 372/31 |

*Primary Examiner*—William L. Sikes
*Assistant Examiner*—Robert E. Wise
*Attorney, Agent, or Firm*—Larson & Taylor

[57] ABSTRACT

The device adapted to regulate the light power emitted by a laser diode (2) associated to an electric supply circuit (32) comprises a photosensor (6) providing an electric signal representing the mean optical power of the laser diode. A circuit (8) associated to the photodetector provides an error signal representing the deviation between the actual light power and an order power. The error signal is applied to a circuit (10) which controls a Peltier element (22) for cooling the laser. The supply circuit (32) either uses constant current or is controlled by a safety branch (30) which is operated in case of a sudden temperature variation of failure of the main servo control. The device may be particularly used in telecommunications.

10 Claims, 5 Drawing Sheets

PROCESS AND DEVICE FOR REGULATING THE LIGHT POWER OF LASER DIODES

BACKGROUND AND SUMMARY OF THE INVENTION

The invention relates to the regulation of laser diodes operating continuously and it finds an important although not exclusive application in the field of optical fiber digital transmissions.

It is known that laser diodes are widely used for optical fiber transmission, in particular because they are capable of operating at much higher frequencies than light emitting diodes. But on the other hand these laser diodes have the disadvantage of presenting considerable variations of the light power emitted in response to the small variation of the current with respect to the threshold value. Now, this threshold value presents appreciable variations which are either reversible, as a function of the temperature more especially, or irreversible following aging more particularly.

To palliate the effects of these variations, it is necessary to provide regulation of the output light power. Processes are already known for regulating the light power emitted by a laser diode under continuous operating conditions, in which an electric signal representative of said light power is compared with an electric reference signal corresponding to a reference power for elaborating an error signal, and the operating conditions of the laser diode are automatically modified as a function of said signal.

Usually, it is the electric current supplying the laser diode which is controlled by a feedback loop whose input value is formed by the difference between the measured output light power and a reference power.

It is frequently necessary to add to this servo control a temperature regulation for present laser diodes must operate at a temperature at most not much higher than the normal ambient temperature. High temperatures in fact accelerate the aging and increase the risk of destruction, whereas on the contrary lowering of the temperature during operation increases the lifespan. Another reason which makes a temperature regulation frequently necessary is the need to remove the heat released at the junction of the laser diode. This temperature regulation is generally effected by cooling with an active element, such as a Peltier effect element, controlled by a second feedback loop whose input signal is formed by the difference between the measured temperature of the laser and the reference temperature.

Different reasons, which will be given in detail further on, cause this solution to be unsatisfactory. In particular, this double regulation requires a larger number of components and it suffers from a defect in its very principle: to maintain the light power emitted, during aging, the supply current must be increased, which causes an increase in heating and in the power consumed by the Peltier effect element, resulting in an increase in the overall power consumed. In addition, it is difficult to measure the temperature of the junction of the laser diode, so that the temperature measured is that of the base of the diode, to which a thermistor is fixed. The temperature differences which exist between the base and the junction will increase gradually with increases of electric current during aging, so that, for a fixed reference temperature, the temperature of the junction increases, which further accelerates aging.

It is an object of the invention to provide an improved regulation process and device. It is a more specific object of the invention to provide a device which is simple in construction and which eliminates the above mentioned positive reaction phenomena.

To this end, the invention uses the fact that the threshold current of a laser diode increases with the temperature according to a law which is approximately exponential, and it proposes more especially a process of the above defined kind which is characterized in that the heat flow extracted from the laser diode is controlled so as to cancel out the error signal while feeding the laser diode with constant electric current.

The invention also proposes a regulation device for implementing the above defined process. This device comprises a photodetector disposed so as to supply an electric signal representative of the mean optical power of the laser diode and a circuit associated with the photodetector for supplying an error signal representative of the difference between the light power and a reference power, as well as a circuit for controlling the cooling means of the laser. It is more especially characterized in that the control circuit is mounted so as to receive the error signal and to control the cooling in a direction tending to cancel out the error signal and in that said supply circuit is a DC circuit.

Such an extremely simple device gives an entirely satisfactory result when the environment of the laser diode does not present sudden thermal shocks, which is for example the case in an undersea cable repeater. When the environment is on the contrary likely to present temperature variations whose rapidity is incompatible with the large time constant of the device such as defined above, which time constant is fixed more especially by the thermal inertia of the elements, the device is advantageously completed by addition of a servo control branch acting on the supply current of the laser diode. But it is essential to bear in mind that this branch has only an accessory role and only comes into play in a transitory fashion, during the time required for the thermal regulation to compensate for the effect of the temperature variation or in the case of failure of the main device.

The invention will be better understood from reading the following description of particular embodiments given by way of examples, and from the comparison which is made thereof with the prior art.

SHORT DESCRIPTION OF THE DRAWINGS

Figure 1:
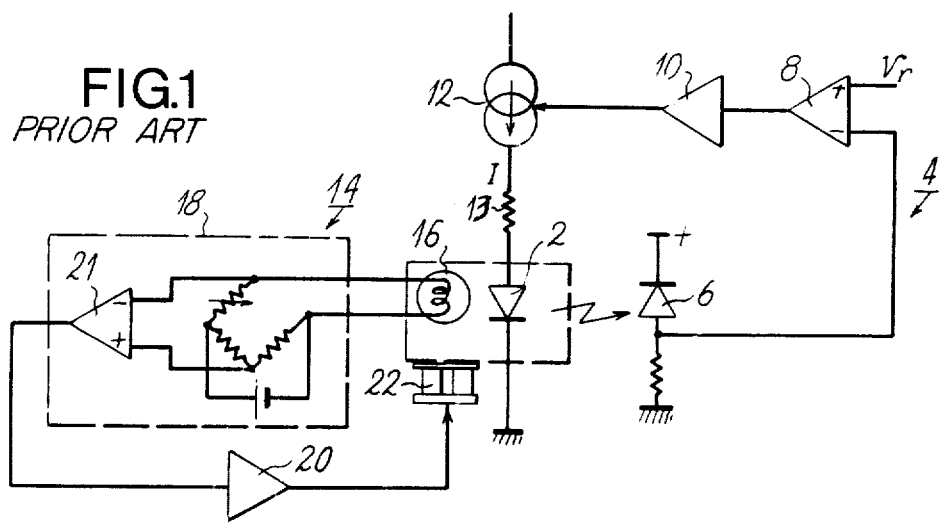
FIG. 1 is a diagram showing a conventional device for regulating the light power of a laser diode.
Figure 3:
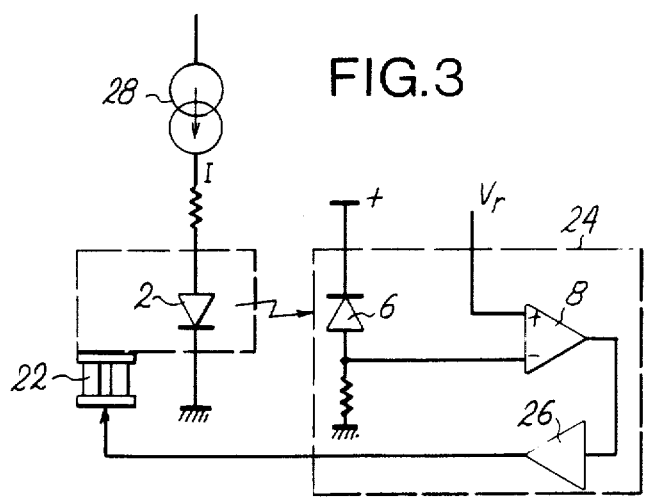
Figure 4:
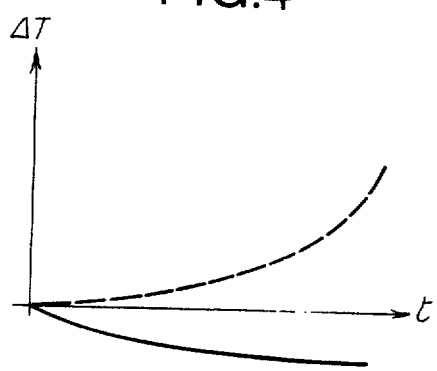
Figure 5:
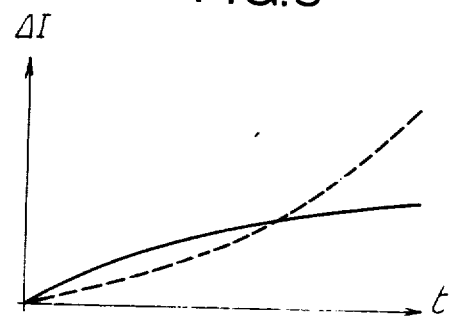
Figure 6:
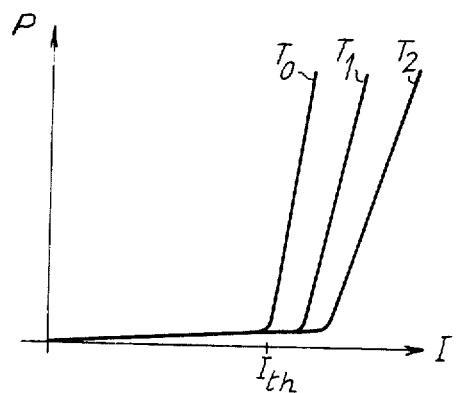
Figure 7:
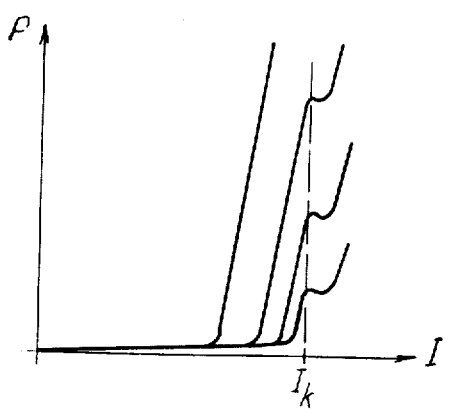
Figure 8:
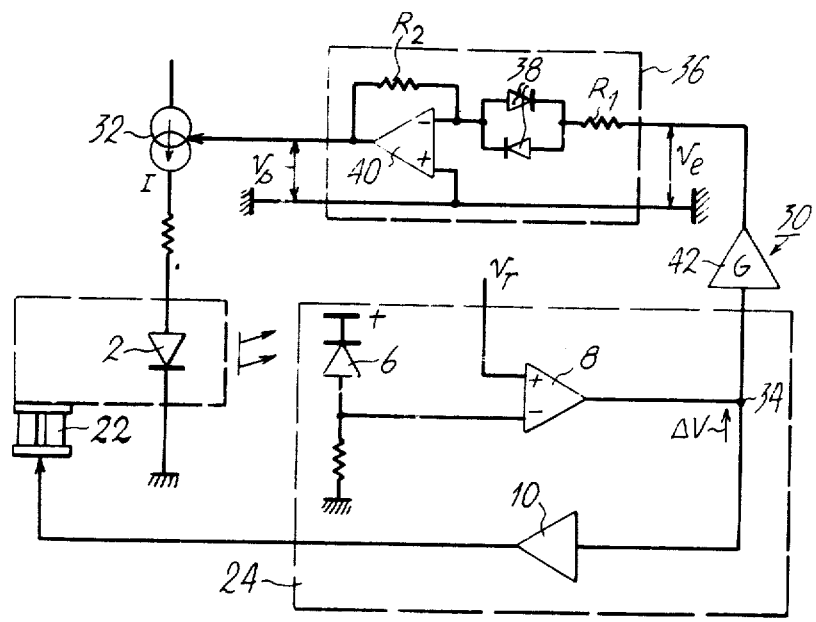
Figure 9:
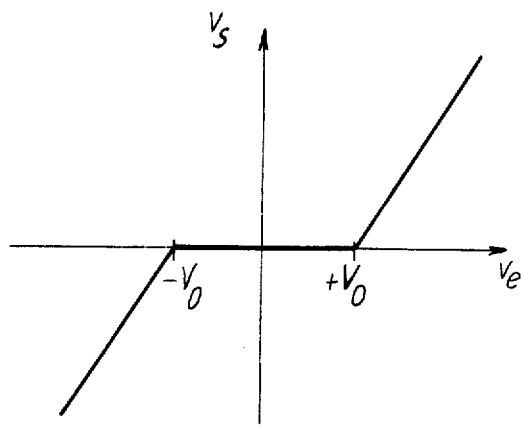
Figure 10:
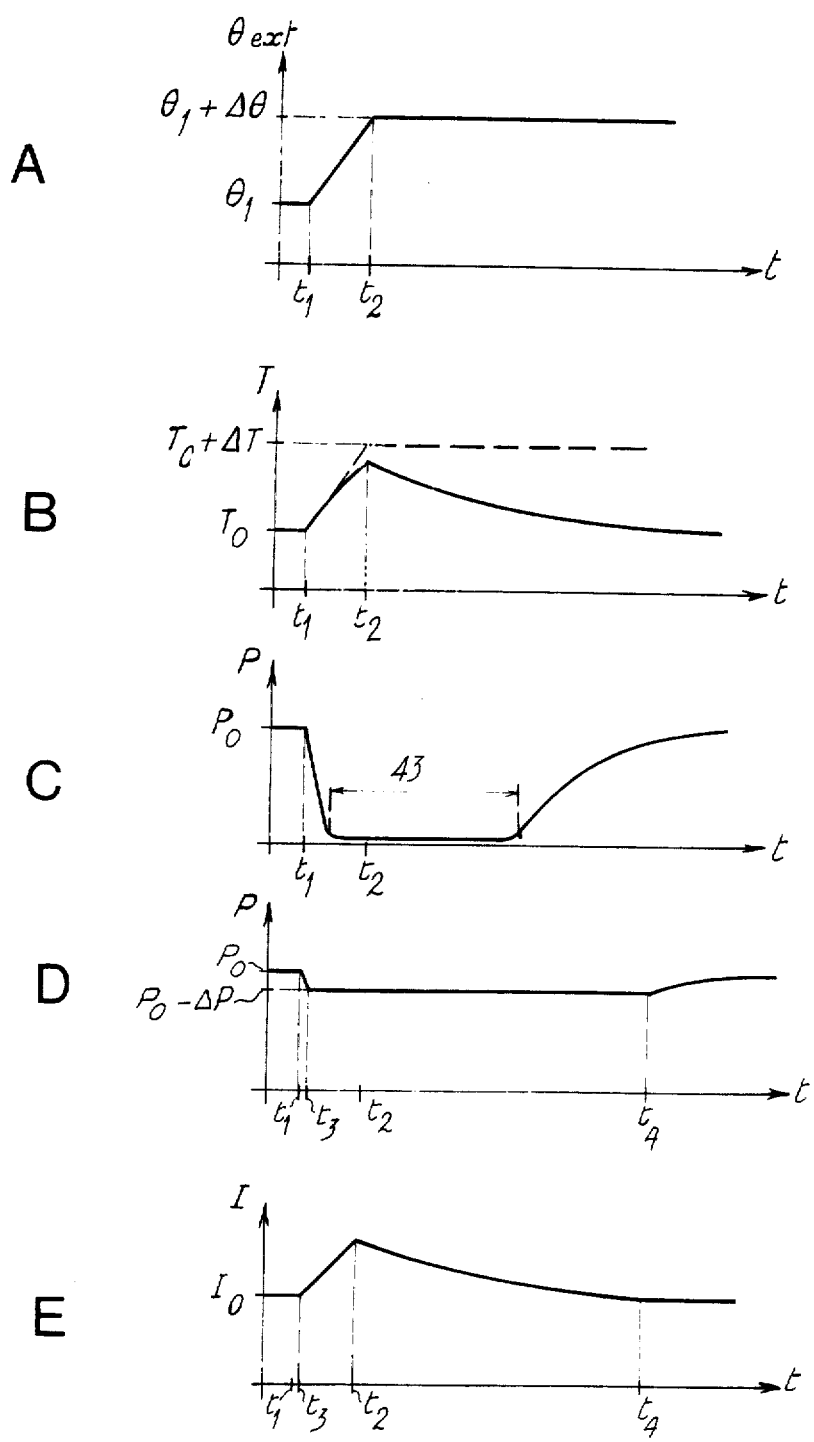
Figure 11:
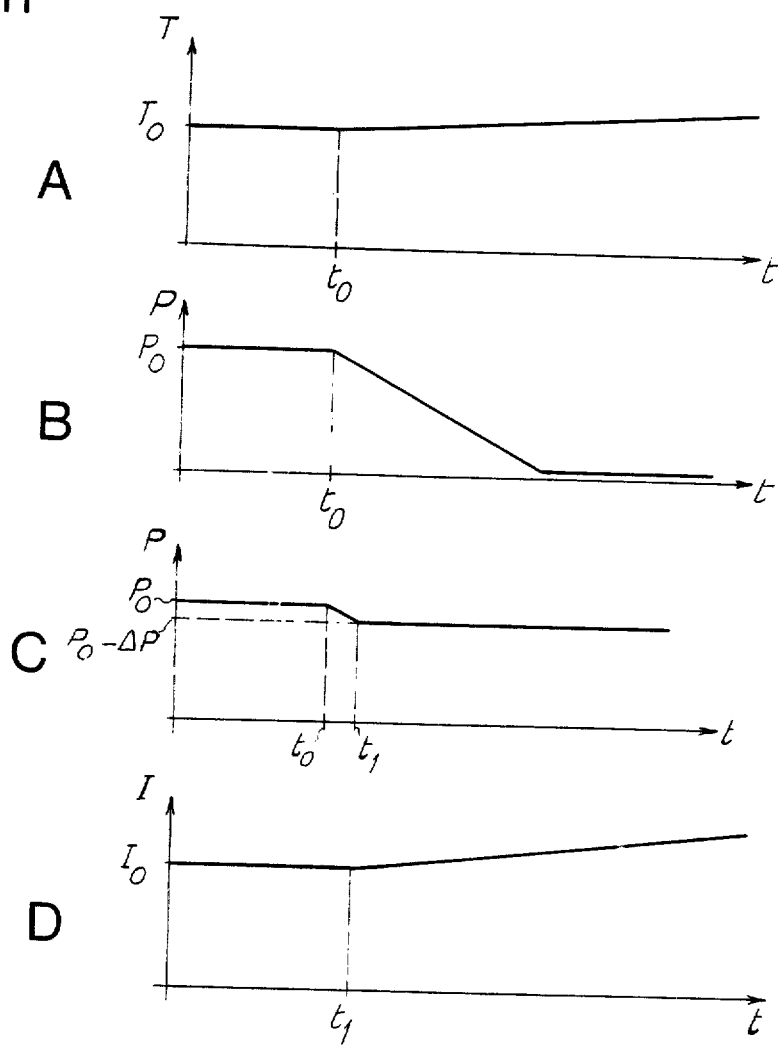
Figure 12:
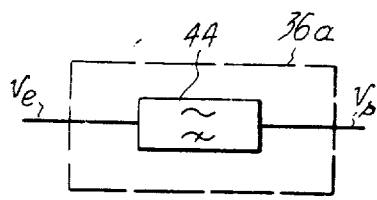
Figure 13:
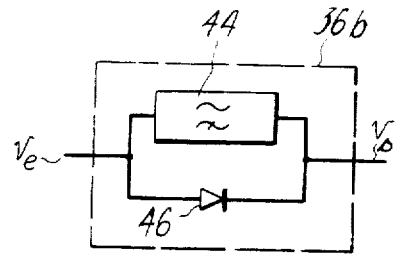

FIG. 3, similar to FIG. 1, shows a device which forms a particularly simple method of implementing the invention;

FIGS. 4 and 5 are curves showing, as a function of time T, the difference $\Delta T$ between the temperature of the laser and its initial temperature and the difference $\Delta I$ between the total current consumption and the initial consumption, for the conventional device shown in FIG. 1 (broken line curve) and for the device of FIG. 3 (solid line curve);

FIGS. 6 and 7 show the variation of the output optical power of the laser as a function of the current, respectively in the case where the slope of the characteristic of the laser diode is not constant and in the case where this characteristic presents violent non linearities;

FIG. 8, similar to FIGS. 1 and 3, shows a device which forms another embodiment of the invention, which differs from that of FIG. 3 in that it comprises an additional security servo control;

FIG. 9 shows the transfer function $v_s(v_e)$ of the quadripole of the device of FIG. 8;

FIGS. 10 are curves for showing the function of the security servo control of FIG. 8 when a rapid variation of the external temperature occurs;

FIGS. 11 show the intervention of the security servo control in the case of failure of the main regulation device;

FIGS. 12 and 13 are detailed diagrams showing variants of FIG. 8.

DETAILED DESCRIPTION OF PREFERRED EMBODIMENTS

Before describing the invention, the typical construction will be briefly recalled for conventional devices for regulating the light power of a laser diode by current variation.

The device of this type shown in FIG. 1 is intended to maintain the light power emitted by a laser diode at a constant value. For that, the device comprises a feedback loop 4 which comprises a photodiode 6 supplying an electric signal proportional to the light power emitted by the laser. For that, the photodiode 6 may be placed for example so as to collect the light which leaves through the rear face of the laser diode. The electric signal from diode 6 is applied to one of the inputs of comparator 8 whose other input receives a reference voltage $V_r$ representing the reference light power. The error signal is thus proportional to the difference between the power effectively emitted and the reference power. An amplifier 10 amplifies this signal to a suitable level for controlling a current source 12, for adjusting the current fed into the laser diode through a resistor 13;

As mentioned above, the known devices frequently comprise a temperature regulation loop. The input element of the temperature regulation loop 14 shown in FIG. 1 is formed by a temperature sensitive element 16 such as a thermistor, whose resistance is a single value function of the temperature. This thermistor is often fixed to the base of the laser and not to the laser diode itself, because of the fragility and small size of this latter component. The output signal from element 16 drives, through a comparator device 18 which supplies and error signal related to the difference between the measured temperature and the reference temperature, an amplifier 20 with appropriate gain and time constant. The amplified error signal controls a cooling element 22 intended to bring the temperature down to a value as close as possible to the reference temperature, more particularly when the external temperature or the heat released by the laser varies. Device 18 may be formed for example by a Wheatstone bridge and a comparator 21.

Figure 2:
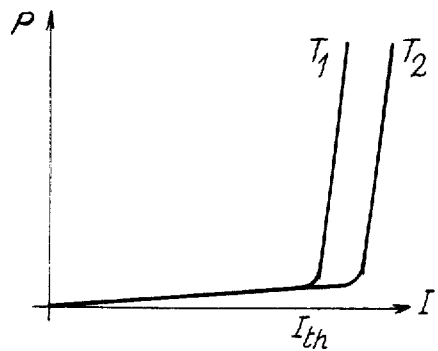
FIG. 2 shows the variation of the optical power P of a laser diode as a function of the current I, for two temperatures T1 and T2, T2 being greater than T1.

The reference temperature, which may be adjustable by acting on one of the elements of the Wheatstone bridge, may be either close to the ambient temperatures usually met with during operation, or appreciably lower. With this arrangement, an important variation of the threshold current $I_{th}$ caused by the temperature variations of the laser diode may be compensated for, as shown in FIG. 2. But the conventional device of FIG. 1 presents numerous drawbacks. It comprises a large number of elements. And, more especially, the temperature regulation loop suffers from a fundamental defect of principle. The servo controlled temperature is that of the base of the laser diode 2, whose temperature presents, with that of the laser diode, a difference which is of the order of 25° to 40° C./W in the best cases. The temperature of the laser therefore always exceeds the reference temperature by an amount which, initially of a few degrees, will be modified because of a positive reaction phenomenon during aging. When the current which source 12 feeds into the laser diode increases, because of the aging of this latter, the amount of heat released increases and causes a temperature increase which further accelerates the aging. The cooling element, formed generally by a Peltier element, has more heat to remove and so consumes more current, which further increases the drift in temperature of the laser and the general consumption. This run-away effect in the long term risks reducing the useful life of the laser diode, especially those which are particularly sensitive to the temperature, such as the recent large wave length laser diodes.

The device of the invention shown in FIG. 3 overcomes this defect, more particularly because it uses input information related to the real temperature of the laser and avoids any positive feedback phenomenon.

The device shown in FIG. 3, in which the elements corresponding to those of FIG. 1 bear the same reference number, only comprises a single servo control loop 24. This loop uses as input element, a sensor sensitive to the light flow emitted by the laser diode 2, for example a photodiode 6. The signal emitted by the photodiode, representative of the optical power, is applied to a comparator 8 which also receives a reference signal $V_r$ representing the optical reference power. But the output signal of the comparator is no longer used for controlling the current as in the case of FIG. 1, but is used for controlling the temperature of the laser diode. For that, the error signal from comparator 8 is applied, through an amplification system 26, whose gain and time constant are determined depending on the desired characteristics, to the cooling element 22. The laser diode 2 is fed by source 28 which, in the simple embodiment of FIG. 3, supplies a constant current I.

The device shown in FIG. 3 operates in the following way, when the light power emitted by the laser diode 2 decreases, because either of an increase in the external temperature, or because of aging of the laser.

An error signal appears at the input of the amplifying chain 26. It causes the cooling element 22 to be controlled in a direction which tends to lower the temperature of the laser diode 2 until the light power emitted is equal to the reference power, determined by the reference voltage $V_r$. In fact, at a given time in the life of the laser and for a given current I, there is a bi-univocal correspondance between the light power and the temperature.

In other words, the intensity of cooling is controlled by a parameter representing the actual temperature of the laser, and not of its base, and it stabilizes the optical power, which is a requirement for correct operation of the system by means of a single feedback loop. During the life of the laser, the temperature of this latter decreases slowly, which slows down the aging process and increases the useful life. The temperature drift goes in a favorable direction and itself slows down, whereas in the case of the conventional system shown in FIG. 1, there is a drift which accelerates by itself.

The advantages of the device shown in FIG. 1 appear immediately; stabilization of the optical power; removal of the heat released by the laser and short term temperature stabilization are provided by a single loop, with a number of component elements almost half that in a conventional device. In addition, elimination of the thermistor 16 provided in the device of FIG. 1 allows a simplified design.

The positive feedback effect presented by the device of FIG. 1 disappears and it should be noted in passing that the temperature drift $\Delta T$ as a function of time in the case of a device such as shown in FIG. 3 (solid line curve in FIG. 4), though it is initially more rapid than with the conventional device of FIG. 1 (broken line curve), slows down and becomes slower in the long term. The fact that the laser diode is fed by a constant current source simplifies the design and reduces the overall longterm current consumption: although in fact the consumption of the Peltier effect cooling element 22 increases first of all more quickly in the case of the device of the invention (FIG. 5), this increase then slows down, so that after a short time, the overall increase $\Delta I$ in consumption becomes lower than in the case of the conventional device.

In addition, the device of the invention allows the effect of particular characteristics of some types of laser diode to be attenuated without addition of additional elements.

In particular, the slope of the characteristic (optical power vs. value of the current) decreases for some semiconductor lasers when the temperature increases or when the component ages, as shown in FIG. 6 where the curves $T_0$, $T_1$, $T_2$ correspond to progressively increasing temperatures or to progressively more accentuated aging. In a conventional device, an additional so called "dynamic" servo control loop must be added, which acts on the amount of modulation of the electric signal for maintaining the modulation amplitude of the optical signal constant. Now, in numerous cases, a reduction in temperature compensates for the effect of aging on the slope of the characteristic, as it does on the threshold current $I_{th}$, which avoids having to add a dynamic servo control loop.

In other cases, the semiconductor diode has a characteristic P (I) which presents violent non linearities, or "kinks", as shown in FIG. 7; they generally appear for a given current $I_k$. The device of FIG. 3, with constant current, allows operation in a zone where such non linearities do not appear.

The simple device shown in FIG. 3 has a relatively long response time, possibly up to several seconds, because of the thermal inertia of the parts. This property is not a drawback in most telecommunications applications, where the external temperature variations are slow. But, when the laser diode is likely to be exposed to sudden variations of the external temperature or when it is desired to maintain approximately the optical power in the case of failure of loop 24 for the time required for action to be taken, the device shown in FIG. 8 may be adopted. This device comprises, in addition to the elements already shown in FIG. 3, an additional branch 30 which may be qualified as safety branch. Branch 30 acts on source 32 supplying the laser diode for adjusting the current I supplied. Branch 30 uses, as input signal, the voltage $\Delta V$ at point 34, at the output of comparator 8. This voltage $\Delta V$ is an increasing function of the difference between the effective power P emitted and the reference power and it is cancelled out with it. Branch 30 is provided for controlling source 32 so as to modify the current I only when the absolute value $|\Delta V|$ of $\Delta V$ exceeds a predetermined threshold $V_0$, i.e. when $|\Delta P|$ exceeds a given threshold value $\Delta P_0$.

Branch 30 only comes into action then in the case of a rapid transitory phenomenon, or when the regulation provided by loop 24 reaches a limit because of extreme temperature conditions, or finally in the case of failure of the cooling element 22 or of the circuits which control it. Under normal permanent operating conditions, $|\Delta P|$ is less than $\Delta P_0$ and the servo control branch 30 does not operate. The laser diode is fed, as in the case of FIG. 3, with constant current I.

For achieving this conditional action, the safety branch 30 may for example comprise a quadripole 36 in which the threshold is obtained by a semiconductor diode bridge 38, mounted head to tail, having a threshold voltage $V_0$. One of the terminals of the bridge 38 is connected to the input of the quadripole by a resistor $R_1$. The other terminal is connected to the inverter input of an operational amplifier 40 whose non inverting input is connected to ground.

Thus, a current is applied to the operational amplifier 40 only if the absolute value $|v_e|$ of the input voltage is greater than $V_0$.

A feedback resistor $R_2$ is placed between the inverter input and the output of the operational amplifier 40, which also forms the output of the quadripole.

The transfer function $v_s(v_e)$ of the quadripole 36 is of the kind shown in FIG. 9, where the threshold effect appears. The slope of the parts of the characteristic corresponding to the intervention of the quadripole is fixed by $R_2/R_1$.

The safety branch 30 tends to bring $v_s$ down to a zero value. It brings the optical power P back not to the reference value $P_0$, but to a value $P_0 \pm \Delta P$, depending on the direction of overshoot of the threshold. The ratio $\Delta P/P_0$ may be fixed at will: in fact, it corresponds to $V_0/G.V_r$, G being the gain of a DC amplifier 42 placed upstream of the quadripole 36. Thus, $\Delta P$ can be given a low value with respect to $P_0$. This reduction of $\Delta P$ is moreover not inevitably required, when it is only desired to absorb the transitory operating conditions. In fact, the main servo control continues to act, with a long time constant, because of the error signal related to $\Delta P$ and which is therefore not zero. By controlling the temperature, the main servo control loop 24 brings the optical power P gradually back to the reference value $P_0$, ending the action of the security servo control loop 36.

FIGS. 10a to 10e show the difference in response between the device of FIG. 3 and that of FIG. 8 in the case of a rapid variation of the external temperature $\theta$, which passes from $\theta_1$ to $\theta_1 + \Delta \theta$ in a brief space of time $t_2-t_1$ (FIG. 10A). The variation in temperature T of the laser will then, in both cases, have the trend shown in FIG. 10B, the temperature drop being slow because of the thermo time constant. In the case of the simple device of FIG. 3, there may be a momentary interruption of emission during a time interval 43 (FIG. 10C). In the case of a device comprising a security branch, this latter comes into action as soon as the optical power has dropped to the value $P_0 - \Delta P$ so as to maintain it at this latter value (FIG. 10D). Branch 30 then comes into play from time $t_3$ to time $t_4$ when the temperature regulation has caused the optical power to be brought back above $P_0-\Delta P$. The current I supplied to the diode only deviates from the reference value $I_0$ during the time interval from $t_3$ to $t_4$ (FIG. 10e).

In the case of a breakdown of the cooling system, the security branch 30 comes into action so as to prevent the optical power of the laser from dropping below the value $P_0-P$, as shown in FIGS. 11a to 11d. FIG. 11a shows the progressive increase in the temperature from time $t_0$ of the breakdown. In the absence of security, the optical power P will be rapidly cancelled out (FIG. 11b). On the contrary, in the case where the security branch 30 is provided, this latter stabilizes the optical power to the value $P_0-P$(FIG. 11c), which maintains transmission by modification of the current I which passes through the laser, while waiting for action to be taken (FIG. 11d). Means may be provided for detecting the permanent presence of a non zero error signal at point 34 and for tripping an alarm.

The invention is susceptible of numerous other embodiments. In particular, the security branch may be formed in a different way from the one shown, for maintaining separation between the permanent working conditions, during which only the main servo control loop functions, from the transitory operating conditions, during which the security branch comes into play.

By way of examples, FIGS. 12 and 13 show circuits 36a and 36b which may be used in replacement of the quadripole 32 of FIG. 8. Instead of providing a non linear transfer function, circuits 36a and 36b comprise a high pass filter 44 for isolating the transitory components of the error signal taken at 34 (FIG. 8). In the case shown in FIG. 13, a threshold diode 46 is placed in parallel with filter 44 for taking over from the main servo control in the case of failure of the cooling element.

We claim:

1. A process for regulating the light power emitted by a laser diode operating under continuous conditions, in which an electric signal representative of said light power is compared with an electric reference signal corresponding to a reference light power for deriving an error signal, and the operating conditions of the laser diode are automatically modified as a function of said signal, characterized in that the heat flow extracted from the laser diode is controlled so as to cancel out the error signal while supplying the laser diode with a constant electric current.

2. Device for regulating the light power output of a laser diode associated with a laser diode cooling means and with an electric supply circuit delivering a constant current under steady operating condition, comprising: photodetector means arranged so as to supply an electric signal representative of an average value of said light power of the laser diode; a circuit associated with the photodetector for supplying an error signal representative of the difference between the light power and a reference power; and a control circuit for controlling the cooling means of the laser, wherein said control circuit is connected to receive the error signal and to control said cooling means in a direction tending to cancel out the error signal.

3. Device according to claim 2, characterized in that it comprises, in addition, a servo control branch (30) controlling the electric supply circuit (32) when the difference between the light power supplied by the laser diode (2) and the reference power exceeds a predetermined threshold.

4. Device according to claim 3, characterized in that said servo control branch comprises an input connected to the output of the circuit (8) associated with the detector and comprises an operational amplifier preceeded by a threshold element (38).

5. Device according to claim 4, characterized in that said servo control branch further comprises a high pass filter.

6. Device according to claim 2, characterized in that it comprises, in addition, a servo control branch (30) controlling the electric supply circuit (32) in response to the rapid variations of the optical output power of the laser.

7. Device according to claim 6, characterized in that said servo control branch comprises an input connected to the output of the circuit (8) associated with the detector and comprises an operational amplifier preceeded by a threshold element (38).

8. Device according to claim 7 characterized in that said servo control branch further comprises a high pass filter.

9. Device according to claim 6, characterized in that said servo control branch comprises an input connected to the output of the circuit (8) associated with the detector and comprises an operational amplifier preceeded by a high pass filter.

10. Device according to claim 9, characterized in that said servo control branch comprises an input connected to the output of the circuit (8) associated with the detector and comprises an operational amplifier preceeded by a high pass filter.

* * * * *